United States Patent
Bock

(10) Patent No.: US 6,707,410 B1
(45) Date of Patent: Mar. 16, 2004

(54) DIGITAL PIXEL SENSOR WITH A DYNAMIC COMPARATOR HAVING REDUCED THRESHOLD VOLTAGE SENSITIVITY

(75) Inventor: Nikolai E. Bock, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/226,079

(22) Filed: Aug. 23, 2002

(51) Int. Cl.$^7$ ................................................ H03M 1/12
(52) U.S. Cl. ......................... 341/155; 327/65; 341/162; 341/169; 348/301
(58) Field of Search ................................ 341/155, 158, 341/159, 162, 169; 327/54, 65, 67; 348/300, 301

(56) References Cited

U.S. PATENT DOCUMENTS

| | | | | |
|---|---|---|---|---|
| 4,611,130 A | * | 9/1986 | Swanson ..................... | 327/65 |
| 5,461,425 A | * | 10/1995 | Fowler et al. .............. | 348/294 |
| 6,218,892 B1 | * | 4/2001 | Soumyanath et al. ....... | 327/537 |
| 6,271,785 B1 | * | 8/2001 | Martin et al. ............... | 341/169 |
| 6,377,303 B2 | * | 4/2002 | O'Connor ................... | 348/308 |

OTHER PUBLICATIONS

Kotani et al., KOJI, "Cmos Charge–Transfer Preamplifier for Offset–Fluctuation Cancellation in Low–Power A/D Converters", IEEE Journal of Solid State Circuits, vol. 33, No. 5, May 1998.

Weste et al., Neil H.E., "Principles of CMOS VLSI Design A Systems Perspective", Chapter 8, pp. 520–526., Dec. 2000, © 2001 Addison–Wesley Publishing Inc.

Phase I SBIR Final Report: Oct. 8, 1998, "Photobit".

* cited by examiner

*Primary Examiner*—Howard L. Williams
(74) *Attorney, Agent, or Firm*—Dickstein Shapiro Morin & Oshinsky LLP

(57) ABSTRACT

A digital pixel sensor architecture has a comparator located within the pixel and a frame memory located outside the pixel. The comparator is used with additional circuitry to perform analog-to-digital conversion. Replacing the analog-to-digital converter and memory of a conventional digital pixel sensor minimizes many issues associated with conventional digital pixel sensors while preserving the architecture's resistance to noise and speed.

36 Claims, 9 Drawing Sheets

DIGITAL PIXEL SENSOR WITH A DYNAMIC COMPARATOR HAVING REDUCED THRESHOLD VOLTAGE SENSITIVITY

FIELD OF INVENTION

The present invention relates to a digital pixel sensor architecture. More specifically, a digital pixel architecture which incorporates a dynamic comparator having reduced sensitivity to threshold voltage mismatches in its input transistors.

BACKGROUND OF THE INVENTION

A conventional digital pixel sensor 100 architecture is illustrated in FIG. 1. The conventional digital pixel sensor 100 includes a photoconversion element, such as a photodiode, for converting optical energy into an analog electrical signal. The electrical signal is supplied to an analog-to-digital converter (ADC), which converts the analog electrical signal into a digital signal. The conventional digital pixel sensor 100 therefore differs from several other pixel sensor architectures, such as CMOS active pixel sensors (APS), because the conventional digital pixel sensor performs local analog-to-digital conversion (i.e., digitization at each pixel) instead of global analog-to-digital conversion (i.e., digitization at a common location outside the pixel).

The conventional digital pixel sensor 100 architecture has several advantages over pixel architectures which perform global analog-to-digital conversion. For example, the analog signal generated by the photodiode 101 is susceptible to substrate noise and column fixed pattern noise. A local digitization architecture minimizes these susceptibilities. Additionally, the conventional digital pixel sensor 100 architecture is capable of operating at a higher speed, since an entire array of pixels may be digitized at once. In contrast, each pixel of an active pixel sensor array must be sequentially digitized. Thus, the gap in speed between sensor architectures such as the digital pixel sensor 100 and an active pixel sensor increases with resolution.

The conventional digital pixel sensor 100 architecture, however, is problematic because the increased circuitry, i.e., the local analog-to-digital converter and the local memory increase circuit complexity which reduces fill factor, i.e., less of the pixel circuitry is devoted to converting light into electrical signals. Additionally, the location of a memory within the pixel makes it difficult to access the information stored in the memory. Accordingly, there is a need and desire for a pixel architecture which is fast, has good fill factor, and minimizes substrate and fixed pattern noise.

SUMMARY OF THE INVENTION

The present invention is directed to a digital pixel sensor (DPS) architecture which incorporates a new comparator and divides the analog-to-digital conversion circuitry between each pixel and a column processing circuit of the pixel array. The digital conversions are performed one row at a time, instead of for the entire array at once. The row-by-row digitization does not degrade the speed of the DPS architecture since the speed of an imaging system is typically limited by a chip's off-chip data output rate. The row-by-row digitization is also advantageous because the limited number of simultaneous conversions provides superior noise immunity. The digitized values are stored in a separate frame memory independent of the pixel circuitry. The DPS architecture of the present invention has a better fill factor because each pixel no longer includes its own frame memory and analog-to-digital converter. At the same time, the DPS architecture of the present invention preserves the superior noise and speed characteristics associated with digital pixel systems. The comparator is preferably of a new design which shares the low power characteristics of dynamic comparators, but which is less sensitive to mismatching of the threshold voltages of its input transistors.

The foregoing and other advantages and features of the invention will become more apparent from the detailed description of exemplary embodiments of the invention given below with reference to the accompanying drawings.

DETAILED DESCRIPTION OF THE INVENTION

Figure 1:
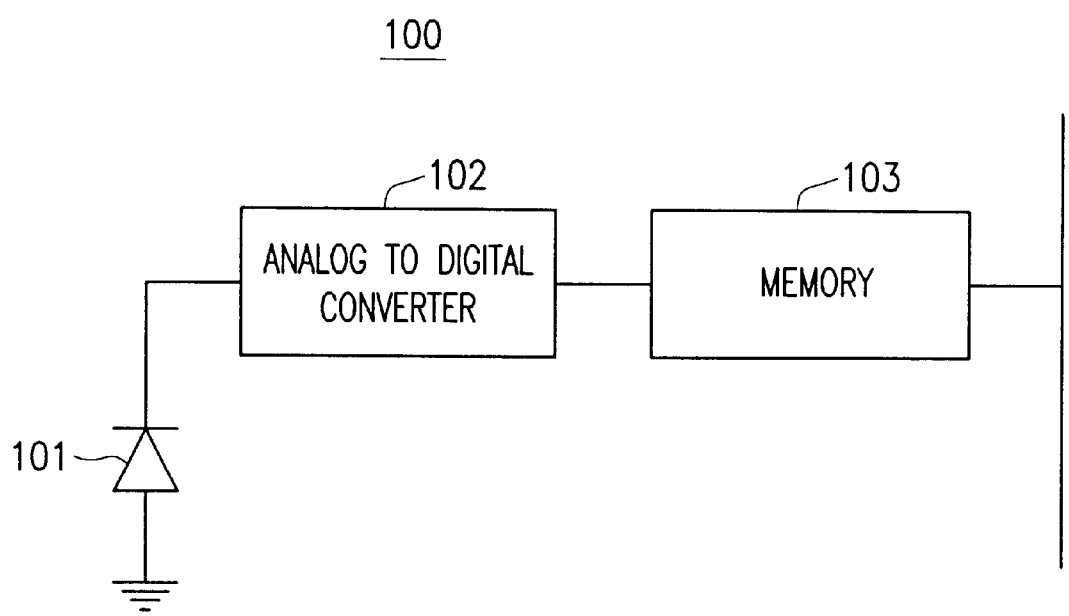
FIG. 1 is an illustration of a prior art digital pixel.
Figure 2:
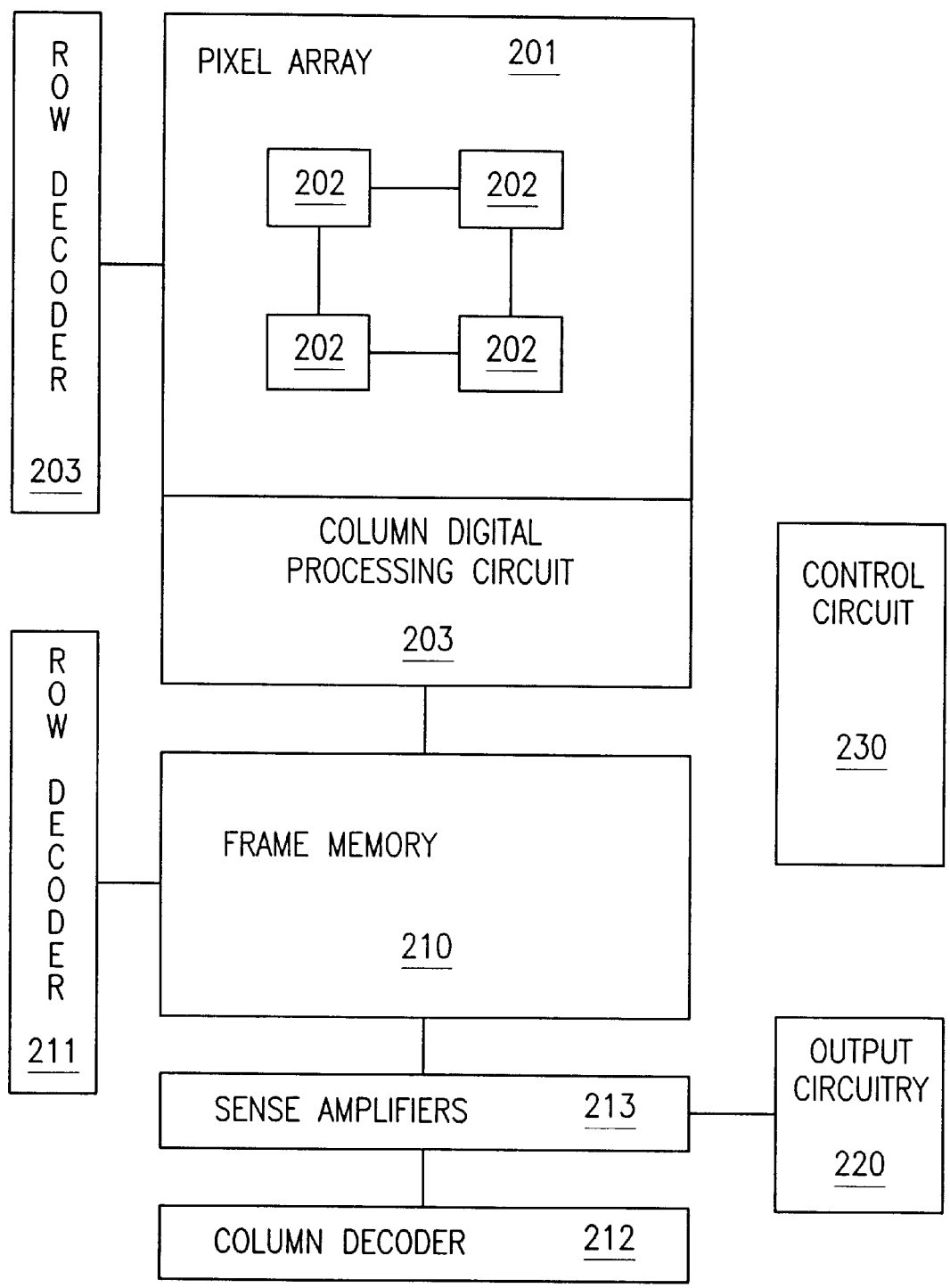
FIG. 2 is an illustration the digital pixel sensor architecture of the present invention.

Now referring to the drawings, where like reference numerals designate like elements, there is shown in FIG. 2 a digital pixel sensor architecture 200 in accordance with the principles of the present invention. The architecture 200 includes a pixel array 201 having a plurality of digital pixels 202. The pixel array 201 is also associated with a column digital processing circuit 203. The structure of and the interconnection between a digital pixel 202 and the column digital processing circuit 203 are shown in greater detail in FIG. 3. Also associated with the pixel array 201 is a first row decoder 203 for decoding a row of pixels 202 in the pixel array 201.

As seen in FIG. 2, the architecture 200 further includes an independent frame memory 210. A second row decoder 211 is associated with the frame memory 210 and used to decode a row of memory cells in the frame memory 210. Also associated with the frame memory 210 is a column decoder 212 for decoding a column of memory cells in the frame memory 210. Additionally, sense amplifiers 213 and output circuitry 220 are used to output data stored in the frame memory 210.

Figure 3:
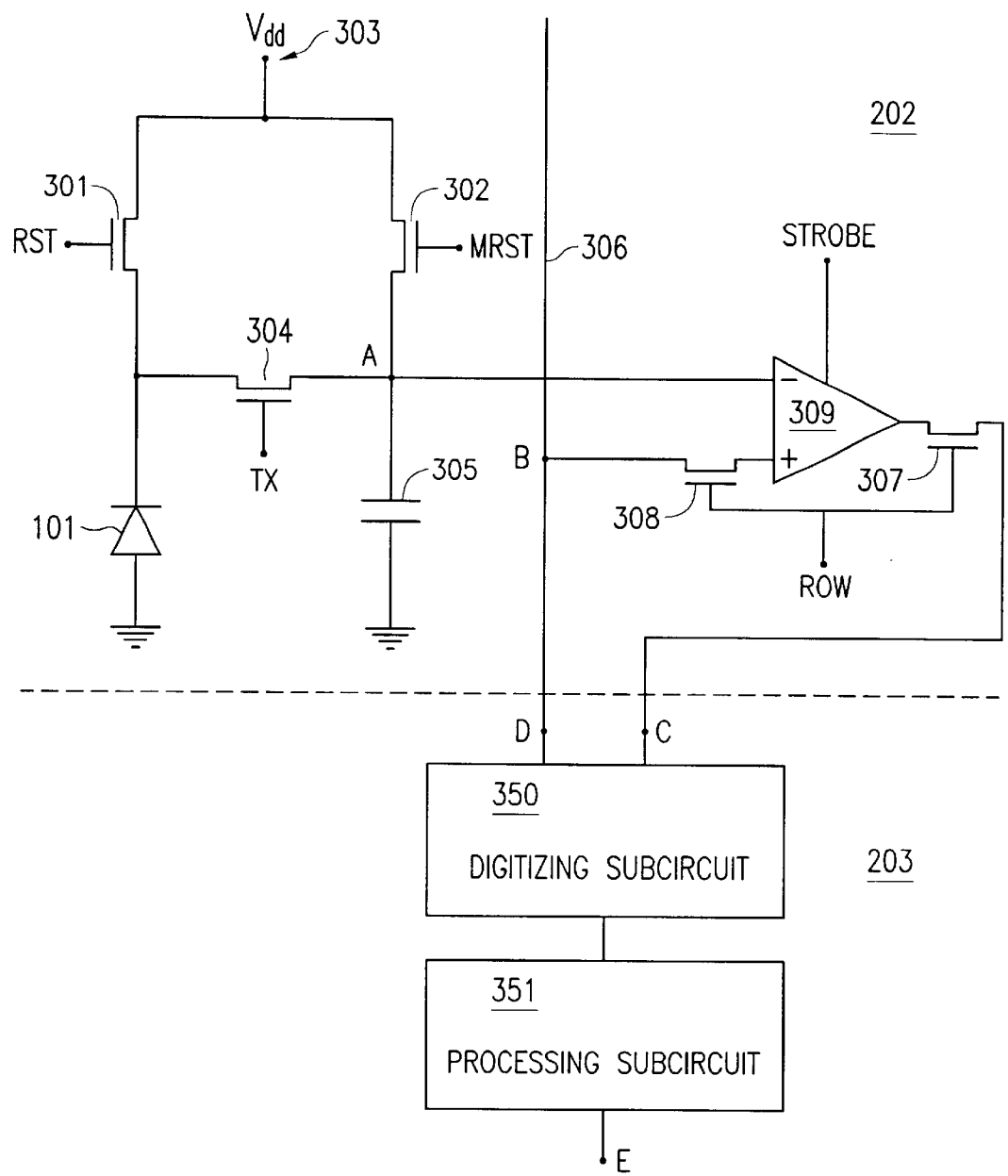
FIG. 3 a more detailed illustration of the digital pixel and column digital processing circuit of in accordance with the present invention.

In FIG. 3, the structure of a digital pixel 202 is illustrated in the top portion of the figure (above the dashed line). The digital pixel 202, includes a photoconversion element, such as a photodiode 101 coupled to a source/drain terminal of a transfer transistor 304 and a source/drain terminal of a reset transistor 301. The digital pixel 202 also includes a memory in the form of a capacitor 305, which is coupled via node-A to the other source/drain terminal of the transfer transistor and to a source/drain terminal of a memory reset transistor 302. The reset and memory reset transistors 301, 302, each have one source/drain terminal coupled to node 303, which is kept at a potential of Vdd. The gates of the reset transistor 301, memory reset transistor 302, and transfer transistor 304 are respectively coupled to control signals RST, MRST, and TX, which may be sequenced by a control circuit, such as the control circuit 230 illustrated in FIG. 2.

Figure 6:
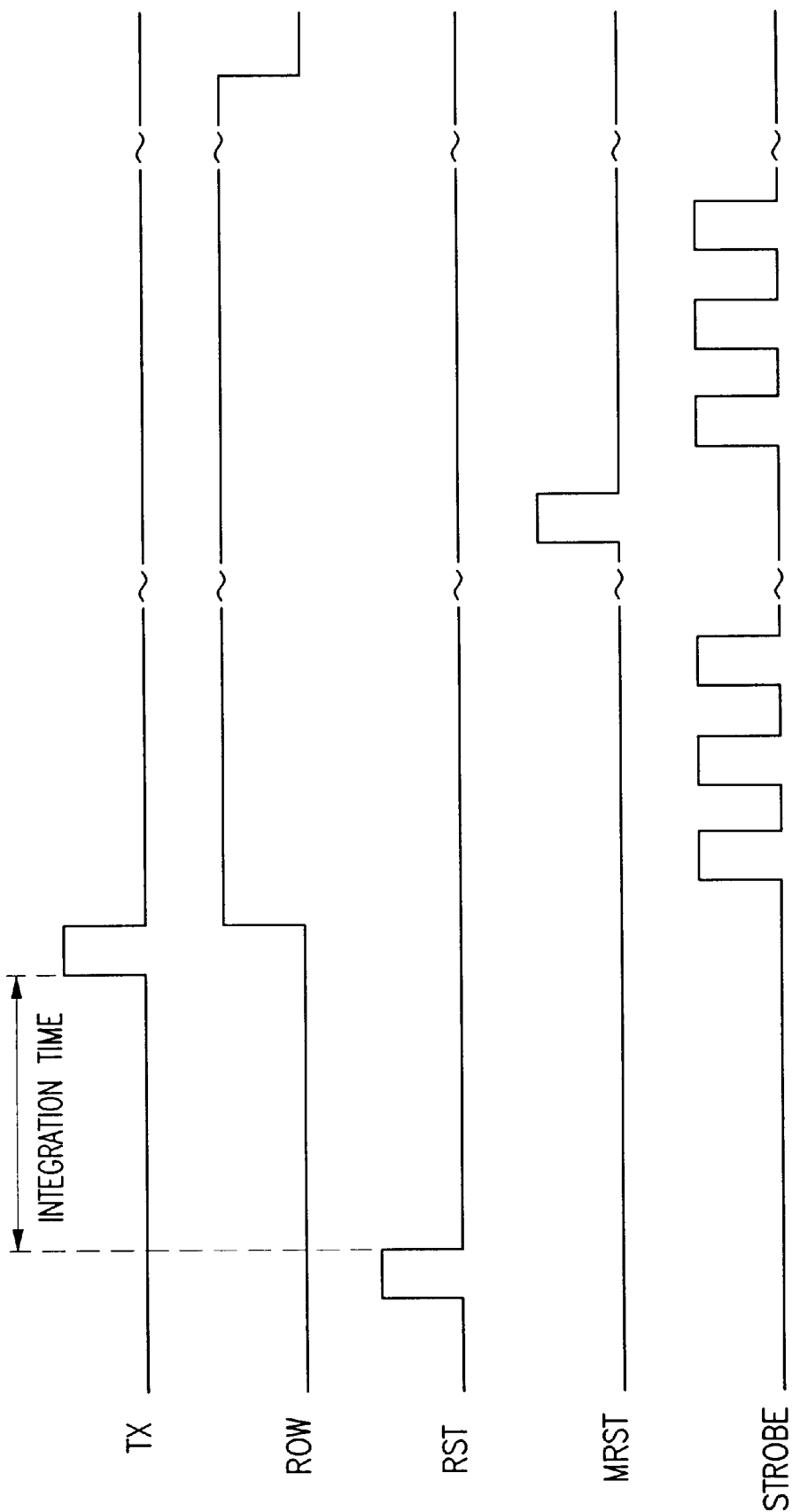
FIG. 6 is a timing diagram showing the operation of the digital pixel architecture illustrated in FIG. 3.

Now referring also to the timing diagram of FIG. 6, the operation of the pixel 202 can be explained. Control signals RST, MRST, TX, and ROW begin low, thereby ensuring that reset transistor 301, memory reset transistor 302, transfer transistor 304, and row transistor 307–308 are non-conducting. Then the RST signal goes high and causes the reset transistor 301 to conduct, thereby coupling the Vdd voltage to the photodiode 101. As a result, the photodiode 101 is set to a known state. After the RST signal goes low again, the photodiode 101 continues to accumulate charge until the signal TX is brought high, causing the transfer transistor 304 to conduct, and thereby permitting some of the charge built up in the photodiode 101 to charge memory capacitor 305. The TX signal subsequently goes low and the transfer transistor 304 stops conducting. The voltage at node-A is the photosignal of the pixel and is based on the charge stored in the capacitor 305.

The ROW signal then goes high, causing row transistors 307, 308 to conduct, thereby permitting the result of the comparator 309 to be input to the digitizing subcircuit 350. The processing of the digitizing subcircuit 350 and the processing subcircuit 351 will be explained later, but for now it is sufficient to note that the comparator 309 of the present invention operates only when the STROBE signal is high. The STROBE signal is therefore related to the digitization process of the signal at node-A; however, the number of pulses and the pulse width will be dependent upon how the digitizing subcircuit 350 is implemented. Each row of pixels in the imaging array has its own STROBE signal, thereby providing a means for power savings. The next event is the MRST signal going high, thereby causing memory transistor 302 to become conductive and Vdd potential to be coupled to the memory capacitor 305. The MRST signal then goes low and memory rest transistor 302 becomes non-conductive. The voltage at node-A now represents the reset signal of the pixel. A second pulse train then follows, to permit the reset signal to be digitized. Finally, ROW signal transitions to a low state.

Although the pixel 202 does not include an analog-to-digital converter, the pixel 202 incorporates a comparator 309, which is used with the column digital processing circuit 203 to digitize the analog signal at node-A. More specifically, node-A is coupled to the minus terminal of the comparator 309. The comparator 309 has its plus terminal coupled to node-B on reference signal line 306, which extends to additional pixels sharing the same column address as the pixel 202. The output and plus input of the comparator 309 are coupled to source/drain terminals of row transistors 307, 308. The transistor 308 serves for reducing parasitic capacitance of line 306. The transistor 307 connects a given row to the read-out line 309, which is common for all pixels in a given column and connect to node-C of the digital processing circuit 203. The plus input of the comparator 309 is further coupled to a digitizing subcircuit 350 of the column digital processing circuit 203 at node C. Additionally, at node D, the digitizing subcircuit 350 is coupled to the plus input of the comparator 309 via node-B and row transistor 308.

Figure 4A:
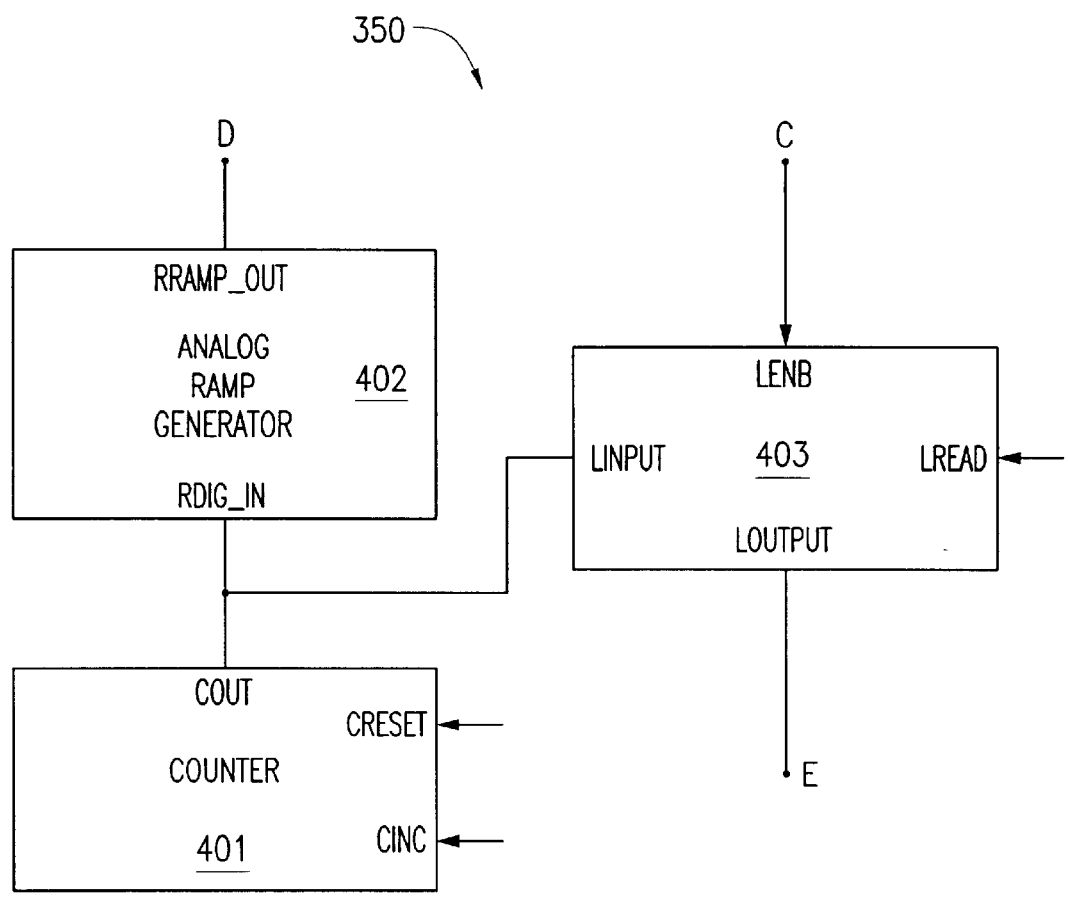
FIG. 4A is an illustration of one embodiment of a digitizing circuit to be used with the comparator of the digital pixel for performing analog-to-digital conversion.

The comparator 309 may be used with a suitable digitizing subcircuit 350 located in the column digital processing circuit 203 to perform analog-to-digital conversion. For example, one embodiment of a suitable digitizing subcircuit 350 is shown in FIG. 4A. This embodiment utilizes the "ramp" method for analog-to-digital conversion. This digitizing subcircuit 350 includes a counter 401 which accepts control signals CRESET and CINC to respectively reset the counter 401 value to zero and to increment the counter 401 value. The counter 401 outputs a digital numeric value at output COUT, which is supplied to an analog ramp generator 402 and a multi-bit latch 403. The analog ramp generator 402 produces an analog signal at output RRAMP_OUT proportional to the digital signal received at input RDIG_IN, which is coupled to the output of the counter 401. The latch 403 receives from node-C the result of the comparison made by comparator 309 (FIG. 3) and couples the result to input LENB, which causes the latch 403 to latch the value at its input terminal LINPUT, which is coupled to the output of the counter 401. A read signal can be applied to the LREAD control terminal of the latch 403 to cause the latched value to be output at terminal LOUTPUT, which outputs the digitized value to the processing subcircuit 351 via node-E. It should be noted that while the analog ramp generator 402 and counter 401 generate global signals and can therefore be relocated, for example, inside control circuit 203 (FIG. 2).

Figure 4B:
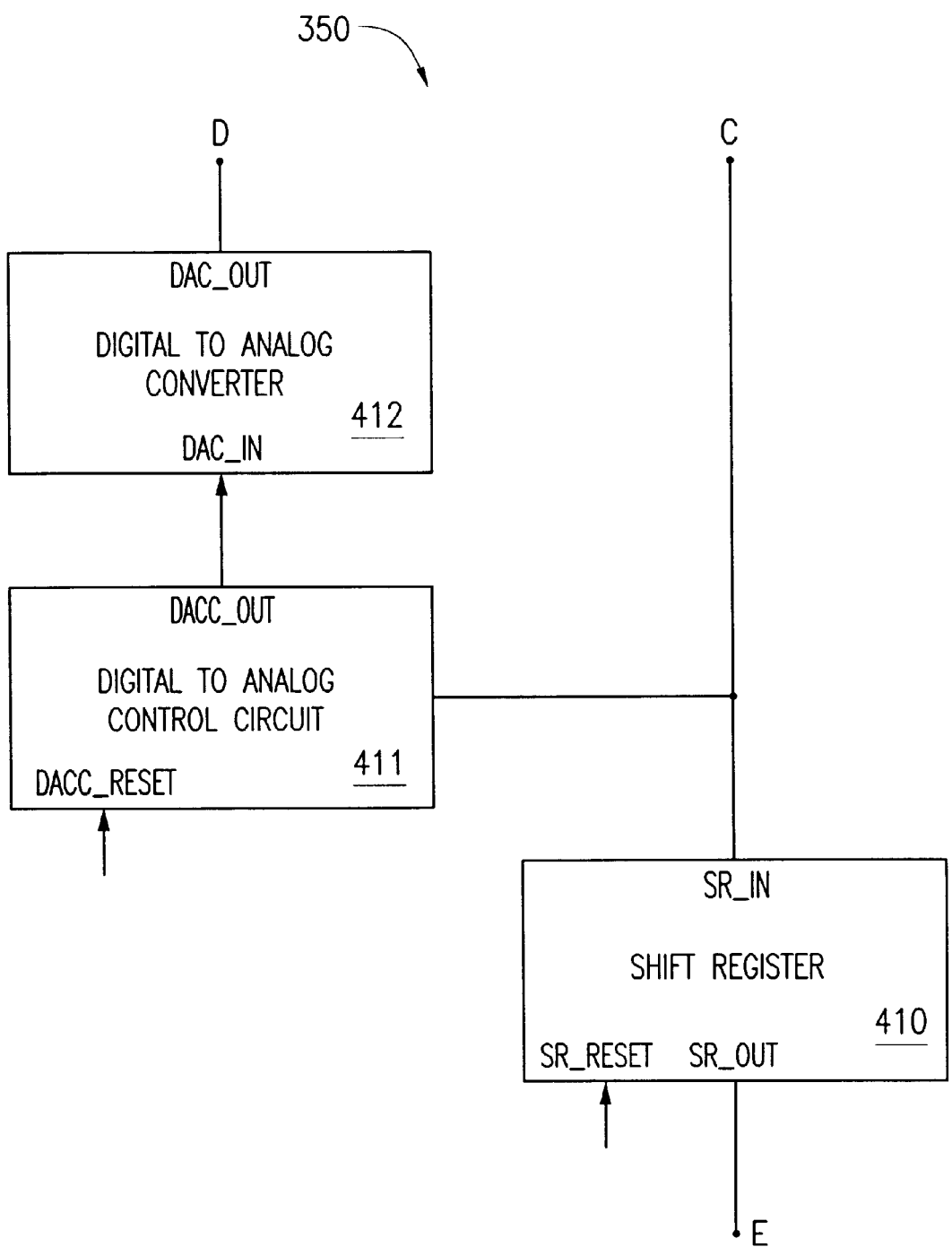
FIG. 4B is an illustration of another embodiment of the digitizing circuit to be used with the comparator of the digital pixel for performing analog-to-digital conversion.

FIG. 4B is an alternate embodiment of the digitizing subcircuit 350. This embodiment utilizes a "successive approximation" method for performing the analog-to-digital conversion and produces the result in a iterative manner, at a rate of one bit per iteration, beginning with the most significant bit and ending with the least significant bit. As can be seen in FIG. 4B, the embodiment requires the use of a shift register 410, a digital-to-analog control circuit 411 and digital-to-analog converter 412 (which may be implemented using switched capacitor banks, or any other suitable method), and a digital-to-analog converter 412. In the beginning, the digital-to-analog control circuit 411 and the shift register 410 are respectively reset by applying control signals to the DACC_RESET and SR_REST terminals, respectively. In response the control circuit 411 outputs a digital signal corresponding to a midpoint value taken about a lower and upper point. Since the control circuit 411 was just reset, the lower point defaults to zero and the upper point defaults to the maximum value. The midpoint value is output from terminal DACC_OUT and then read by the digital-to-analog converter 412 at input DAC_IN. The converter 412 produces an analog signal corresponding to the digital input at terminal DAC_IN on output terminal DAC_OUT, which is supplied to the comparator 309 (FIG. 3) via node-D, node-B, and transistor 308.

The result of the comparison becomes the answer for the current iteration, which in this first round, corresponds to the most significant bit. The result is stored into the shift register 410 and also provided to the digital-to-analog control circuit 411, which calculates a new midpoint value taken around a different upper and lower range, based upon result of the prior round comparison. The processing proceeds as described above, until the iteration completes for the least significant bit. At this time, the value stored in the shift register may be read and provided to the processing subcircuit 351 via node-E.

It should be noted that although the STROBE signal was not illustrated in either FIGS. 4A or 4B, both embodiments can optionally utilize the strobe signal as a clocking mechanism for the digitizing subcircuit 350, since each step of the digitization is dependent upon the operation of the comparator 309. Alternatively, the digitizing subcircuit 350 can be clocked and controlled by any other suitable control circuit, such as control circuit 230 (FIG. 2).

Figure 5:
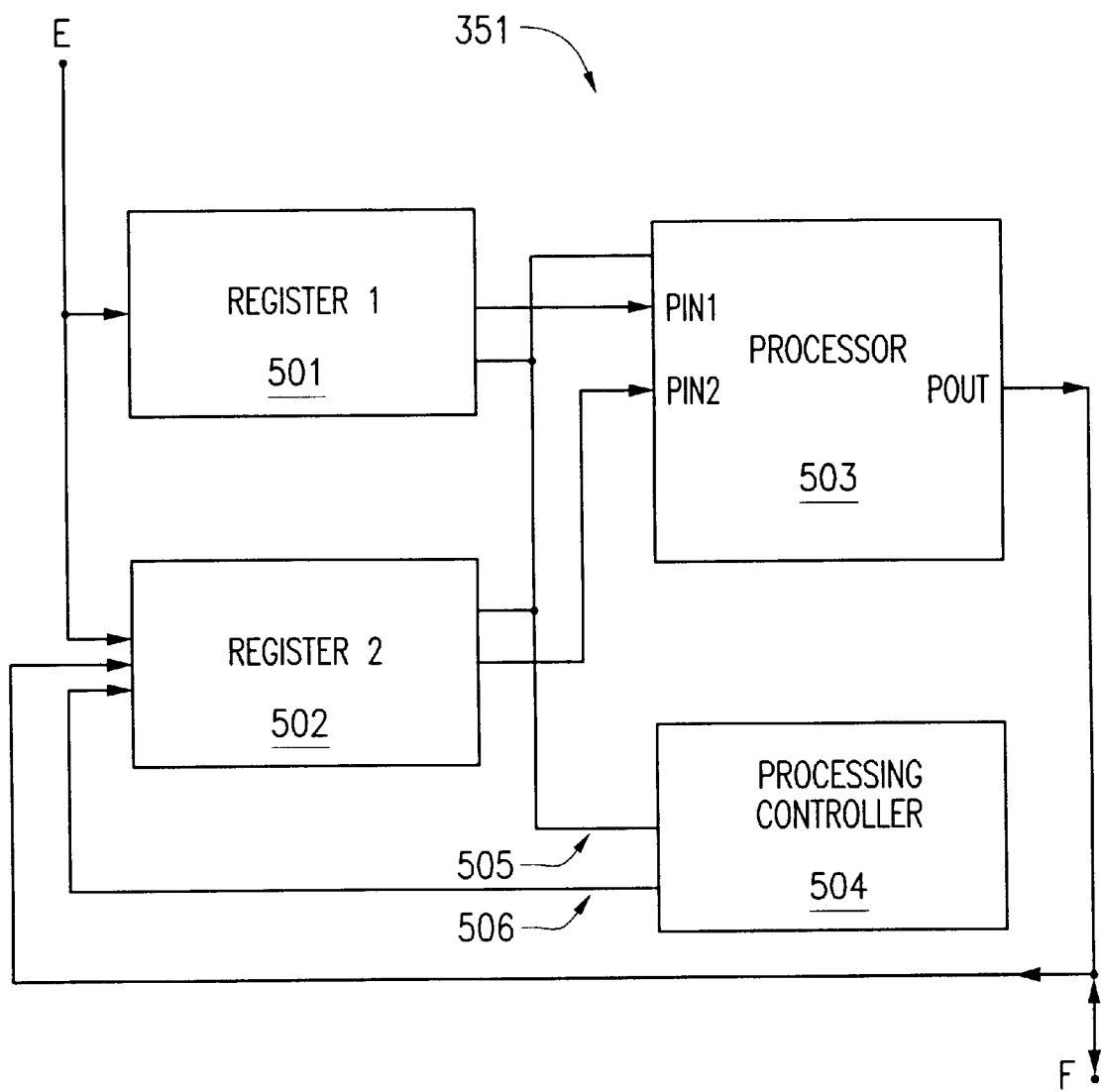
FIG. 5 is an illustration of a processing subcircuit portion of the column digital processing circuit.

The processing subcircuit 351 is illustrated in FIG. 5, and includes at least two registers 501, 502, a processor 503, and a processing controller 504. Each of the registers 501, 502 are capable of receiving and storing a value provided from the digitizing subcircuit 350 at node-E. Register 502 is also capable of storing a value received from the frame memory (via node F). The processor 503 is a circuit which must be able perform at least addition and subtraction on the contents of the two registers 501, 502, which can be provided to the processor 503 at terminals PIN1, PIN2. The result computed by the processor 503 is made available at node-F via terminal POUT. A processing control circuit 504 is coupled to the registers 501, 502 and the processor 503 via a control bus 505. The processing control circuit 504 may also be coupled to the control circuit 230 (FIG. 2).

The processing circuit 351 is used to add or subtract two digital signals. For example, to implement double sampling or correlated double sampling, a photo signal is subtracted from a previous reset signal or from the current reset signal, respectively. Alternatively, the processing control circuit 504 may output an offset on signal line 506 to one of the registers 502 so that an offset may be added to a photo or reset signal.

The design of the processing subcircuit 351 may be altered to take advantage of any properties associated with the type of analog-to-digital conversion used in the digitizing circuit 350. For example, if as in FIG. 4B the digital signal at node-E is provided at a rate of one bit per iteration, the registers 501, 502 and processor 503 may be adapted to operate in a pipelined manner by performing bitwise addition. For example, registers 501, 502 may be shift registers and the processor 503 may be a bitwise adder.

The comparator 309 (FIG. 3) in the pixel 202 is a key element in the analog-to-digital conversion of the pixel signal. Ideally, a comparator suitable for use as comparator 309 should feature high resolution and low power consumption. Dynamic comparators feature low power consumption. However, conventional dynamic comparators are problematic because minor mismatches in the threshold voltages of their two input transistors may cause the comparator to output a false result. On the other hand, the use of traditional high precision comparators should be avoided in the pixel due to their high power consumption and the sheer number of pixels present in a high resolution sensor.

Figure 7A:
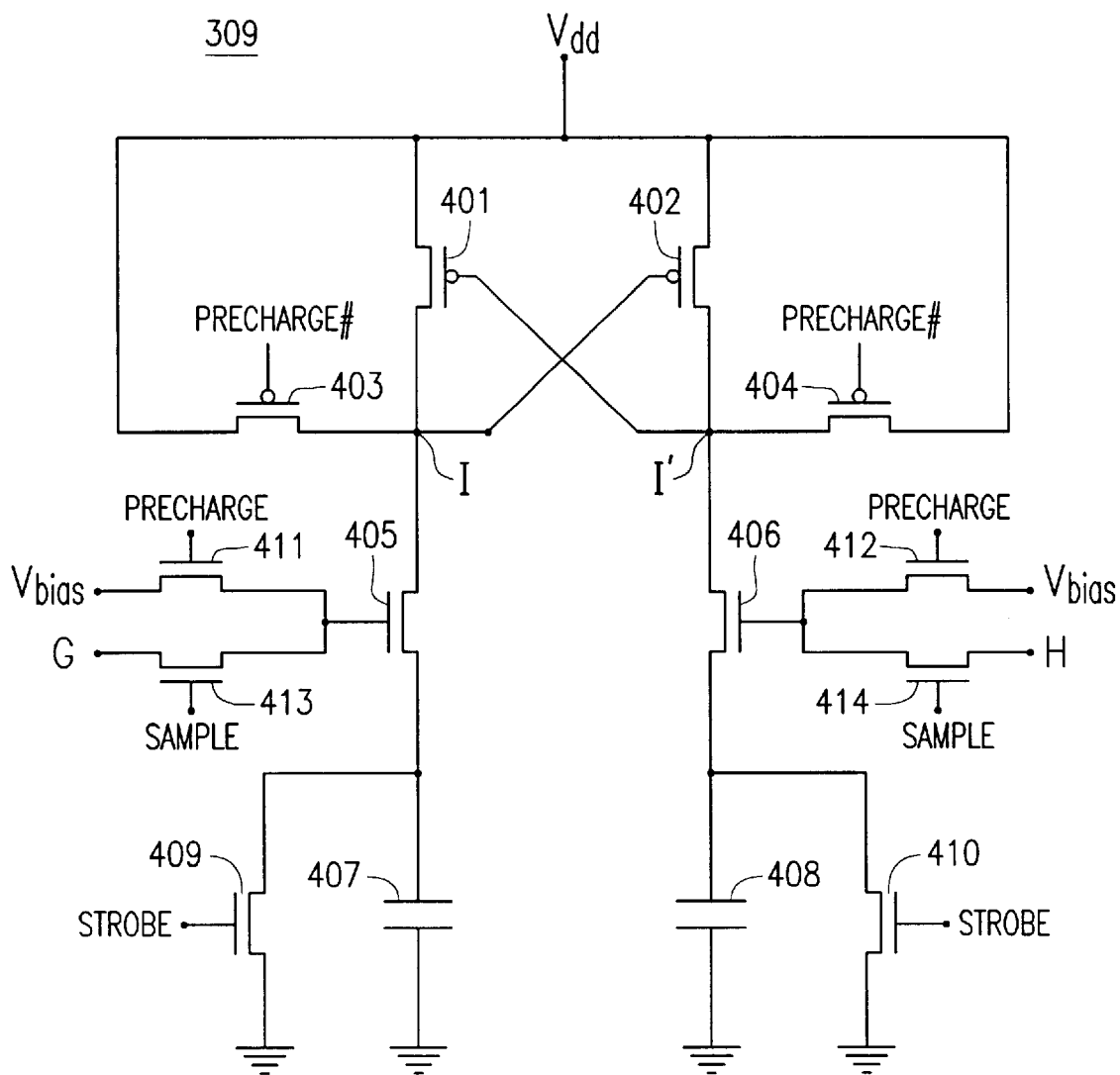
FIG. 7A is an illustration of the dynamic comparator which may be used in the pixel architecture of the present invention.

The present invention therefore contemplates using a new comparator design for comparator 309. As illustrated in FIG. 7A, comparator 309 includes two PMOS transistors 401, 402, each having a first source/drain terminal coupled to a Vdd potential source and a second source/drain terminal coupled to output nodes I and I'. The gates of each PMOS transistor 401, 402 are also cross coupled to nodes I' and I, respectively.

The output nodes I, I' (I is the comparator decision, I' is the complement of I) are also coupled a first source/drain terminal of NMOS precharge transistors 403, 404, respectively. The second source/drain terminals of the NMOS precharge transistors 403, 404 are coupled to a Vdd potential source.

Transistor 405 is the NMOS input transistor for the minus signal. Transistor 405 has one source/drain terminal coupled to node I and another source/drain terminal coupled to a first source/drain terminal of the transistor 409 and capacitor 407. The gate of input transistor 405 is coupled in parallel to a source/drain terminal of a transistor 411 and to a first source/drain terminal of transistor 413. The second source/drain terminal of transistor 411 is coupled to a Vbias voltage source, while the second source/drain terminal of transistor 413 is coupled to the minus terminal of the comparator 309.

Transistor 406 is the NMOS input transistor for the plus signal. Transistor 406 has one source/drain terminal coupled to node I' and another source/drain terminal coupled to a first source/drain terminal of transistor 410 and capacitor 408. The gate of input transistor 406 is coupled in parallel to a first source/drain terminal of transistor 412 and to a first source/drain terminal of transistor 414. The second source/drain terminal of transistor 412 is coupled to a Vbias voltage source, while the second source/drain terminal of transistor 414 is coupled to the plus terminal of the comparator 309.

Figure 7B:
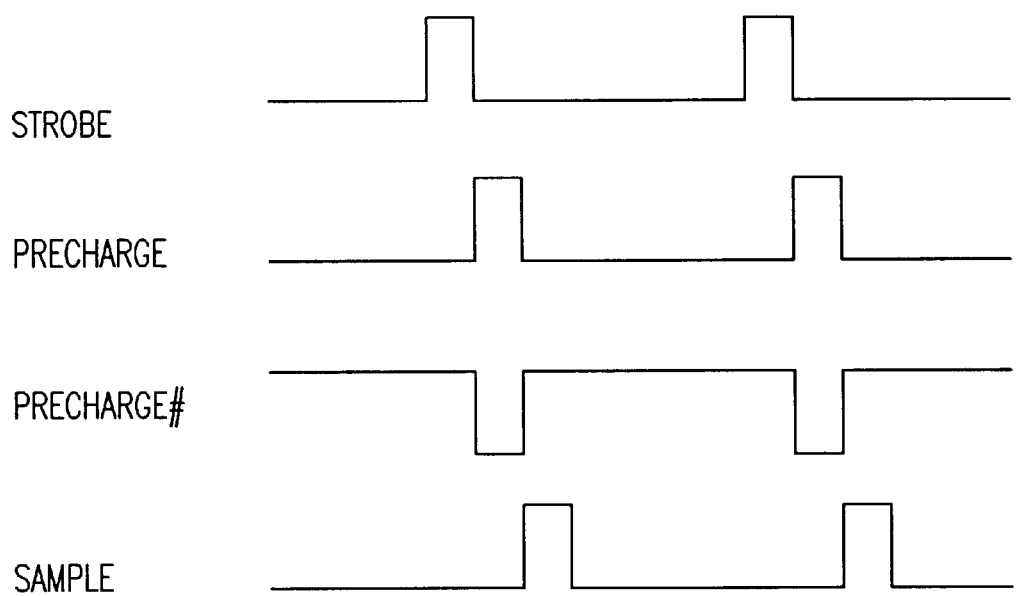
FIG. 7B is a timing diagram showing the operation of the dynamic comparator.

Referring now also to the timing diagram of FIG. 7B, the comparator 309 operates as follows. The STROBE signal is brought high and causes capacitors 407 and 408 to respectively discharge through transistors 409, 410. The STROBE signal then goes low. The PRECHARGE signal, which was low, is brought high, while the PRECHARGE# signal, which was high, is brought low. This permits the Vbias voltage, which is set to be slightly more than the threshold voltage of the input transistors 405, 406, to cause the input transistors 405, 406 to conduct. Additionally, with PRECHARGE# being low, this permits transistors 403, 404 to conduct. Thus, the Vdd potential source begins to respectively charge capacitors 407, 408. The Vdd potential source will continue to charge the capacitors 407, 408 until the voltage at the source is of each respective input transistor 405, 406 is at Vbias minus the threshold voltage of the respective input transistor 405, 406, i.e., the voltage at the source of transistor 405 is charged until it is at Vbias minus the threshold voltage of transistor 405, while the voltage at the source of transistor 406 is charged until it is at Vbias minus the threshold voltage of transistor 406. This isolates the effect of having different threshold voltages on the two input transistors 405, 406 because each transistor's 405, 406 source voltage is at the same offset (i.e., Vbias) from its threshold voltage.

The PRECHARGE signal then goes low and PRECHARGE# goes high. When the SAMPLE signal goes high, transistors 413, 414 conduct to couple the signals at node G and H (which should have a voltage greater than the Vbias) to the gates of input transistors 405, 406 respectively. The input transistor 405, 406 with the greater voltage will have a lower gate barrier and will sink more current. There is no load on either PMOS transistors 401, 402 until the voltage at one of the output nodes I/I' exceed the threshold voltage of the transistors. The comparator 309 utilizes the charge stored in capacitors 407, 408 in making the comparison and there is no through current. Thus, the comparator 309 achieves lower power consumption while maintaining isolation from a mismatch of input transistor threshold voltages.

The present invention is therefore directed to a digital pixel sensor architecture in which each digital pixel in a pixel array includes a comparator which can be used with a suitable digitizing subcircuit located in a column digital processing circuit associated with the pixel array. The column digital processing circuit also includes an processing subcircuit which supports at least subtracting photo and reset signals. The comparator of the digital pixel is preferably one which is designed to minimize power consumption and susceptibility to mismatches in threshold voltages in the input transistors.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed is:

1. A method for comparing a first signal and a second signal, comprising:
    precharging a source of a first input transistor to a first voltage, said first voltage being at a fixed offset less than a threshold voltage of said first input transistor;
    precharging a source of a second input transistor to a second voltage, said second voltage being at the fixed offset less than a threshold voltage of said second input transistor;
    coupling said first signal to a gate of said first input transistor;
    coupling said second signal to a gate of said second input transistor;
    sinking a first current through said first input transistor at a first rate related to a difference between a voltage of said first signal and said first voltage;
    sinking a second current through said second input transistor at a second rate related to a difference between a voltage of said second signal and said second voltage;
    if said first input transistor sinks a predetermined amount of current before said second input transistor, latching a first output node to a first predetermined voltage and latching a second output node to a second predetermined voltage; and
    if said second input transistor sinks a predetermined amount of current before said first input transistor, latching the second output node to the first predetermined voltage and latching the first output node to the second predetermined voltage;
    wherein said step of precharging a source of a first input transistor comprises,
        coupling a capacitor to said source of said first input transistor;
        discharging said capacitor by coupling both plates of said capacitor to ground;
        coupling a power supply voltage to a drain of said first input transistor; and
        coupling a bias voltage to a gate of said first input transistor, wherein said first input transistor conducts between the source and the drain until a voltage at the source is equal to the power supply voltage minus the threshold voltage of said first transistor.

2. The method of claim 1, further comprising,
    discharging said capacitor by coupling both plates of said capacitor to ground.

3. A method for comparing a first signal and a second signal, comprising:
    precharging a source of a first input transistor to a first voltage, said first voltage being at a fixed offset less than a threshold voltage of said first input transistor;
    precharging a source of a second input transistor to a second voltage, said second voltage being at the fixed offset less than a threshold voltage of said second input transistor;
    coupling said first signal to a gate of said first input transistor;
    coupling said second signal to a gate of said second input transistor;
    sinking a first current through said first input transistor at a first rate related to a difference between a voltage of said first signal and said first voltage;
    sinking a second current through said second input transistor at a second rate related to a difference between a voltage of said second signal and said second voltage;
    if said first input transistor sinks a predetermined amount of current before said second input transistor, latching a first output node to a first predetermined voltage and latching a second output node to a second predetermined voltage; and
    if said second input transistor sinks a predetermined amount of current before said first input transistor, latching the second output node to the first predetermined voltage and latching the first output node to the second predetermined voltage;
    wherein said step of precharging a source of a second input transistor comprises,
        coupling a capacitor to said source of said second input transistor;
        coupling a power supply voltage to a drain of said second input transistor;
        coupling a bias voltage to a gate of said second input transistor, wherein said second input transistor conducts between the source and the drain until a voltage at the source is equal to the power supply voltage minus the threshold voltage of said second transistor.

4. The method of claim 3, further comprising,
    discharging said capacitor by coupling both plates of said capacitor to ground.

5. A dynamic comparator, comprising:
    a first PMOS transistor having a first source/drain terminal coupled to a power supply voltage and a second source/drain terminal coupled to a first output node and a gate coupled to a second output node;
    a second PMOS transistor having a third source/drain terminal coupled to the power supply voltage and a fourth source/drain terminal coupled to said second output node and a gate coupled to said first output node;
    a first input transistor having a drain coupled to said first output node, a source coupled to a first capacitor, and a gate coupled to a first input node; and
    a second input transistor having a drain coupled to said second output node, a source coupled to a second capacitor, and a gate coupled to a second input node.

6. The dynamic comparator of claim 5, further comprising,
    a first discharge device for discharging said first capacitor; and
    a second discharge device for discharging said second capacitor.

7. The dynamic comparator of claim 5, further comprising,
    a first precharge transistor for selectively coupling the power supply voltage to the drain of said first input transistor;
    a second precharge transistor for selectively coupling a bias voltage to the gate of said first input transistor;
    wherein, when said first and second precharge transistors are conducting, said source of said first input transistor is precharged to a first voltage equal to said bias voltage minus a threshold voltage of said first input transistor.

8. The dynamic comparator of claim 7, further comprising:

a third precharge transistor for selectively coupling the power supply voltage to the drain of said second iput transistor;

a fourth precharge transistor for selectively coupling the bias voltage to the gate of said second input transistor;

wherein,
when said third and fourth precharge transistors are conducting, said source of said second input transistor is precharged to a second voltage equal to said bias voltage minus a threshold voltage of said first input transistor.

9. A method for operating a pixel, comprising:

resetting a potential at a photodiode to a first predetermined state;

accumulating charge at said photodiode;

transferring accumulated charge to a capacitor to cause a transfer node to take a transferred potential related to said accumulated charge;

comparing said transferred potential with a reference signal; and outputting a first result of said comparison to digitize said transferred potential;

resetting a potential at said transfer node to a second predetermined state;

comparing said second predetermined state with a second reference signal to digitize said second predetermined state;

outputting a second result of said comparison to digitize said transferred potential;

wherein said reference signal and said second reference signal are generated outside said pixel.

10. A method for operating a pixel, comprising:

resetting a potential at a photodiode to a first predetermined state;

accumulating charge at said photodiode;

transferring accumulated charge to a capacitor to cause a transfer node to take a transferred potential related to said accumulated charge;

comparing said transferred potential with a reference signal; and outputting a first result of said comparison to digitize said transferred potential;

wherein said reference signal is generated outside the pixel wherein said reference signal is a ramp signal generated outside the pixel.

11. A method for operating a pixel, comprising:

resetting a potential at a photodiode to a first predetermined state;

accumulating charge at said photodiode;

transferring accumulated charge to a capacitor to cause a transfer node to take a transferred potential related to said accumulated charge;

comparing said transferred potential with a reference signal; and outputting a first result of said comparison to digitize said transferred potential;

wherein said reference signal generated outside the pixel and is a successive approximation based upon a lower threshold and a higher threshold, said lower and higher threshold being derived from upon previous comparisons.

12. A method for operating a pixel, comprising:

resetting a potential at a photodiode to a first predetermined state;

accumulating charge at said photodiode;

transferring accumulated charge to a capacitor to cause a transfer node to take a transferred potential related to said accumulated charge;

comparing said transferred potential with a reference signal; and outputting a first result of said comparison to digitize said transferred potential;

wherein
said reference signal is generated outside the pixel; and
said first result is transferred to a processor.

13. A method for operating a pixel, comprising:

resetting a potential at a photodiode to a first predetermined state;

accumulating charge at said photodiode;

transferring accumulated charge to a capacitor to cause a transfer node to take a transferred potential related to said accumulated charge;

comparing said transferred potential with a reference signal; and outputting a first result of said comparison to digitize said transferred potential;

wherein
said reference signal is generated outside the pixel; and
an offset value is added to said first result.

14. The method of claim 9, wherein said first and second results are transferred to a processor.

15. The method of claim 14, wherein a difference between said first and second results is computed by said processor.

16. A pixel, comprising:

a photodiode;

a capacitor;

a transfer transistor, said transfer transistor having one source/drain coupled to the photodiode and another source/drain coupled to the capacitor;

a reset transistor for controllably coupling a reset voltage to said photodiode;

a memory reset transistor for controllably coupling the reset voltage to said capacitor; and a comparator, said comparator having a first signal terminal coupled to said capacitor, a second signal terminal coupled to a reference signal source and an output terminal.

17. The pixel of claim 16, further comprising, a first row transistor, said first row transistor coupled between said second signal terminal and said reference signal source; and a second row transistor, said second row transistor coupled to said output terminal.

18. The pixel of claim 16, wherein said comparator further comprises, a first PMOS transistor having a first source/drain terminal coupled to a power supply voltage and a second source/drain terminal coupled to a first output node and a gate coupled to a second output node;

a second PMOS transistor having a third source/drain terminal coupled to the power supply voltage and a fourth source/drain terminal coupled to said second output node and a gate coupled to said first output node;

a first input transistor having a drain coupled to said first output node, a source coupled to a first capacitor, and a gate coupled to a first input node; and a second input transistor having a drain coupled to said second output node, a source coupled to a second capacitor, and a gate coupled to a second input node.

19. The pixel of claim 18, further comprising, a first discharge device for discharging said first capacitor; and a second discharge device for discharging said second capacitor.

20. The pixel of claim 18, further comprising, a first precharge transistor for selectively coupling the power supply voltage to the drain of said first input transistor;

a second precharge transistor for selectively coupling a bias voltage to the gate of said first input transistor;

wherein,
when said first and second precharge transistors are conducting, said source of said first input transistor is precharged to a first voltage equal to said bias voltage minus a threshold voltage of said first input transistor.

21. The pixel of claim 20 further comprising:

a third precharge transistor for selectively coupling the power supply voltage to the drain of said second iput transistor;

a fourth precharge transistor for selectively coupling the bias voltage to the gate of said second input transistor;

wherein,
when said third and fourth precharge transistors are conducting, said source of said second input transistor is precharged to a second voltage equal to said bias voltage minus a threshold voltage of said first input transistor.

22. An imaging system, comprising:

a pixel array, said pixel array comprising a plurality of pixels, each of said pixels further comprising,
a photodiode;
a capacitor;
a transfer transistor, said transfer transistor having one source/drain coupled to the photodiode and another source/drain coupled to the capacitor;
a reset transistor for controllably coupling a reset voltage to said photodiode;
a memory reset transistor for controllably coupling the reset voltage to said capacitor; and
a comparator, said comparator having a first signal terminal coupled to said capacitor, a second signal terminal coupled to a reference signal source and an output terminal;

a column digital processing circuit, said column digital processing circuit further comprising,
a digitizing subcircuit; and
a processing subcircuit.

23. The imaging system of claim 22, wherein each of said pixels further comprises,
a first row transistor, said first row transistor coupled between said second signal terminal and said reference signal source; and
a second row transistor, said second row transistor coupled to said output terminal.

24. The imaging system of claim 22 wherein said digitizing subcircuit cooperates with said comparator to digitize potential at said first signal terminal.

25. The imaging system of claim 24, wherein said digitizing subcircuit further comprises,
a multibit latch, said multibit latch having an latch enable terminal, an input terminal, and an output terminal;
an analog ramp generator, said analog ramp generator having an digital input and an analog output; and
a counter, said counter having an output terminal;
wherein,
the input of said latch is coupled to the output of said counter;
the latch enable of said latch is coupled to the output of said comparator;
the input of said analog ramp generator is coupled to the output of said counter; and
the output of said analog ramp generator is coupled to said second signal terminal.

26. The imaging system of claim 25, wherein the output of said latch is coupled to a processing subcircuit.

27. The imaging system of claim 26, wherein said processing subcircuit further comprises,
at least one processing subcircuit register; and
an adder, said adder having at least two inputs and at least one output;
wherein said adder is adapted to support both addition and subtraction.

28. The imaging system of claim 27, wherein said at least one output of said adder is coupled to a frame memory.

29. The imaging system of claim 24, wherein said digitizing subcircuit further comprises,
a shift register, said shift register having a shift register input and a shift register output;
a digital-to-analog converter controller, said digital-to-analog converter controller having a reset terminal and a control output;
a digital-to-analog converter, said digital-to-analog converter having a control input and an analog output;
wherein,
said shift register input is coupled to the output of said comparator;
said control input of said digital-to-analog control circuit is coupled to said output of said comparator;
said output of said digital-to-analog control circuit is coupled to said input of said digital-to-analog converter.

30. The imaging system of claim 29, wherein said shift register output is coupled to a processing subcircuit.

31. The imaging system of claim 30, wherein said processing subcircuit comprises:
at least one processing subcircuit register; and
an adder, said adder having at least two inputs and at least one output;
wherein said adder is adapted to support both addition and subtraction.

32. The imaging system of claim 31, wherein said at least one output of said adder is coupled to a frame memory.

33. The imaging system of claim 24, wherein said comparator further comprises,
a first PMOS transistor having a first source/drain terminal coupled to a power supply voltage and a second source/drain terminal coupled to a first output node and a gate coupled to a second output node;

a second PMOS transistor having a third source/drain terminal coupled to the power supply voltage and a fourth source/drain terminal coupled to said second output node and a gate coupled to said first output node;

a first input transistor having a drain coupled to said first output node, a source coupled to a first capacitor, and a gate coupled to a first input node; and a second input transistor having a drain coupled to said second output node, a source coupled to a second capacitor, and a gate coupled to a second input node.

34. The dynamic comparator of claim 33, further comprising, a first discharge device for discharging said first capacitor; and a second discharge device for discharging said second capacitor.

35. The dynamic comparator of claim 33, further comprising, a first precharge transistor for selectively coupling the power supply voltage to the drain of said first input transistor;

a second precharge transistor for selectively coupling a bias voltage to the gate of said first input transistor;

wherein, when said first and second precharge transistors are conducting, said source of said first input transistor is precharged to a first voltage equal to said bias voltage minus a threshold voltage of said first input transistor.

36. The dynamic comparator of claim 35, further comprising:

a third precharge transistor for selectively coupling the power supply voltage to the drain of said second input transistor;

a fourth precharge transistor for selectively coupling the bias voltage to the gate of said second input transistor;

wherein, when said third and fourth precharge transistors are conducting, said source of said second input transistor is precharged to a second voltage equal to said bias voltage minus a threshold voltage of said first input transistor.

* * * * *

UNITED STATES PATENT AND TRADEMARK OFFICE
CERTIFICATE OF CORRECTION

PATENT NO. : 6,707,410 B1
DATED : March 16, 2004
INVENTOR(S) : Nikolai E. Bock

It is certified that error appears in the above-identified patent and that said Letters Patent is hereby corrected as shown below:

Column 5,
Line 14, "able perform" should read -- able to perform --.

Column 9,
Line 9, "iput" should read -- input --;

Column 11,
Line 30, "iput" should read -- input --;

Column 12,
Line 6, "an" should read -- a --.

Signed and Sealed this

Eighth Day of November, 2005

JON W. DUDAS
*Director of the United States Patent and Trademark Office*